United States Patent
Yasunishi

(10) Patent No.: US 10,679,861 B2
(45) Date of Patent: Jun. 9, 2020

(54) MANUFACTURING METHOD OF A SEMICONDUCTOR DEVICE

(71) Applicant: TOYODA GOSEI CO., LTD., Kiyosu-shi (JP)

(72) Inventor: Kota Yasunishi, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 104 days.

(21) Appl. No.: 15/921,391

(22) Filed: Mar. 14, 2018

(65) Prior Publication Data
US 2018/0277375 A1 Sep. 27, 2018

(30) Foreign Application Priority Data
Mar. 24, 2017 (JP) .................. 2017-059165

(51) Int. Cl.
*H01L 21/285* (2006.01)
*H01L 29/45* (2006.01)
(Continued)

(52) U.S. Cl.
CPC .. *H01L 21/28575* (2013.01); *H01L 21/02068* (2013.01); *H01L 21/32134* (2013.01); *H01L 29/452* (2013.01); *H01L 29/66143* (2013.01); *H01L 29/66212* (2013.01); *H01L 29/872* (2013.01); H01L 21/02244 (2013.01); H01L 21/02252 (2013.01); H01L 29/2003 (2013.01)

(58) Field of Classification Search
CPC ......... H01L 21/28575; H01L 21/32134; H01L 29/452; H01L 29/66143; H01L 29/872; H01L 21/02244; H01L 29/2003
See application file for complete search history.

(56) References Cited

U.S. PATENT DOCUMENTS 5,656,825 A * 8/1997 Kusumoto ............. C30B 1/023
257/66
6,226,160 B1 * 5/2001 Gallagher ............. B82Y 10/00
360/324.2
(Continued)

FOREIGN PATENT DOCUMENTS

JP  S62-120022 A  6/1987
JP  3965610 B2   8/2007
(Continued)

OTHER PUBLICATIONS

Notice of Reasons for Refusal, dated Feb. 18, 2020, in Japanese Patent Application No. 2017-059165 and English Translation.

*Primary Examiner* — Feifei Yeung Lopez
(74) *Attorney, Agent, or Firm* — McGinn I.P. Law Group, PLLC.

(57) ABSTRACT

A manufacturing method of a semiconductor device comprises forming an ohmic electrode on a surface of a semiconductor substrate, the ohmic electrode including an aluminum layer in a side opposite to a side in contact with the semiconductor substrate, performing a heat treatment on the ohmic electrode, performing an acid treatment on a surface of the aluminum layer in the ohmic electrode that has been subjected to the heat treatment and forming a wiring electrode in the side of the aluminum layer opposite to the side where the semiconductor substrate is provided after the acid treatment.

20 Claims, 3 Drawing Sheets

(51) Int. Cl.
   *H01L 29/66* (2006.01)
   *H01L 21/3213* (2006.01)
   *H01L 29/872* (2006.01)
   *H01L 21/02* (2006.01)
   *H01L 29/20* (2006.01)

(56) References Cited

U.S. PATENT DOCUMENTS

| | | | | |
|---|---|---|---|---|
| 2007/0131926 A1* | 6/2007 | Lee | ............ | H01L 27/3274 |
| | | | | 257/40 |
| 2007/0215901 A1* | 9/2007 | Shibata | ............ | C30B 25/02 |
| | | | | 257/189 |
| 2008/0135868 A1* | 6/2008 | Okagawa | ............ | H01L 33/04 |
| | | | | 257/99 |
| 2012/0217591 A1 | 8/2012 | Kamada | | |
| 2013/0122669 A1* | 5/2013 | Koyama | ............ | H01L 29/66045 |
| | | | | 438/167 |
| 2014/0327034 A1* | 11/2014 | Toyota | ............ | H01L 33/32 |
| | | | | 257/99 |

FOREIGN PATENT DOCUMENTS

| | | | |
|---|---|---|---|
| JP | 4597653 B2 | 12/2010 | |
| JP | 2012-178419 A | 9/2012 | |
| JP | 2015-070026 A | 4/2015 | |

* cited by examiner

MANUFACTURING METHOD OF A SEMICONDUCTOR DEVICE

CROSS-REFERENCE TO RELATED APPLICATIONS

The present application claims priority from Japanese patent application 2017-059165 filed on Mar. 24, 2017, the entirety of the content of which is hereby incorporated by reference into this application.

BACKGROUND

Field

The present disclosure relates to a manufacturing method for a semiconductor device.

Related Art

Some semiconductor devices, including a semiconductor substrate, an ohmic electrode, and a wiring electrode, include a barrier metal layer provided between the ohmic electrode and the wiring electrode to prevent metal diffusion between the ohmic electrode and the wiring electrode (JP No. 4597653).

Such semiconductor devices as in JP No. 4597653 may be manufactured by a method including performing heat treatment to achieve ohmic contact in a contact portion between the semiconductor substrate and the ohmic electrode, after the semiconductor substrate, the ohmic electrode, the barrier metal layer, and the wiring electrode are formed. Unfortunately, such a method might result in the ohmic electrode diffusing to the surface of the wiring electrode through the barrier metal layer. Such metal diffusion results in factors for compromising the reliability of the semiconductor device such as lower adhesion between electrodes and mounting defect. The metal diffusion may be prevented by performing the heat treatment on the ohmic electrode formed on the semiconductor substrate, and then forming the barrier metal layer and the wiring electrode. This manufacturing method can prevent the metal diffusion between the ohmic electrode and the wiring electrode during the heat treatment, but results in a semiconductor device with a high electrical resistance value. Supposedly, this occurs due to negative factors between the ohmic electrode and the wiring electrode including: metal contamination or impurity attachment on the ohmic electrode surface having occurred during the heat treatment; and formation of an oxide film on the ohmic electrode surface as a result of the ohmic electrode being exposed to the atmosphere. In view of the above, a technique that can prevent the metal diffusion between the ohmic electrode and the wiring electrode, while preventing a semiconductor device from having a high electrical resistance value has been called for.

SUMMARY

An aspect of the present disclosure provides a manufacturing method for a semiconductor device. The manufacturing method for a semiconductor device comprises forming an ohmic electrode on a surface of a semiconductor substrate, the ohmic electrode including an aluminum layer in a side opposite to a side in contact with the semiconductor substrate, performing a heat treatment on the ohmic electrode, performing an acid treatment on a surface of the aluminum layer in the ohmic electrode that has been subjected to the heat treatment and forming a wiring electrode in the side of the aluminum layer opposite to the side where the semiconductor substrate is provided after the acid treatment.

DETAILED DESCRIPTION

A. First Embodiment

A-1. Configuration of Semiconductor Device

Figure 1:
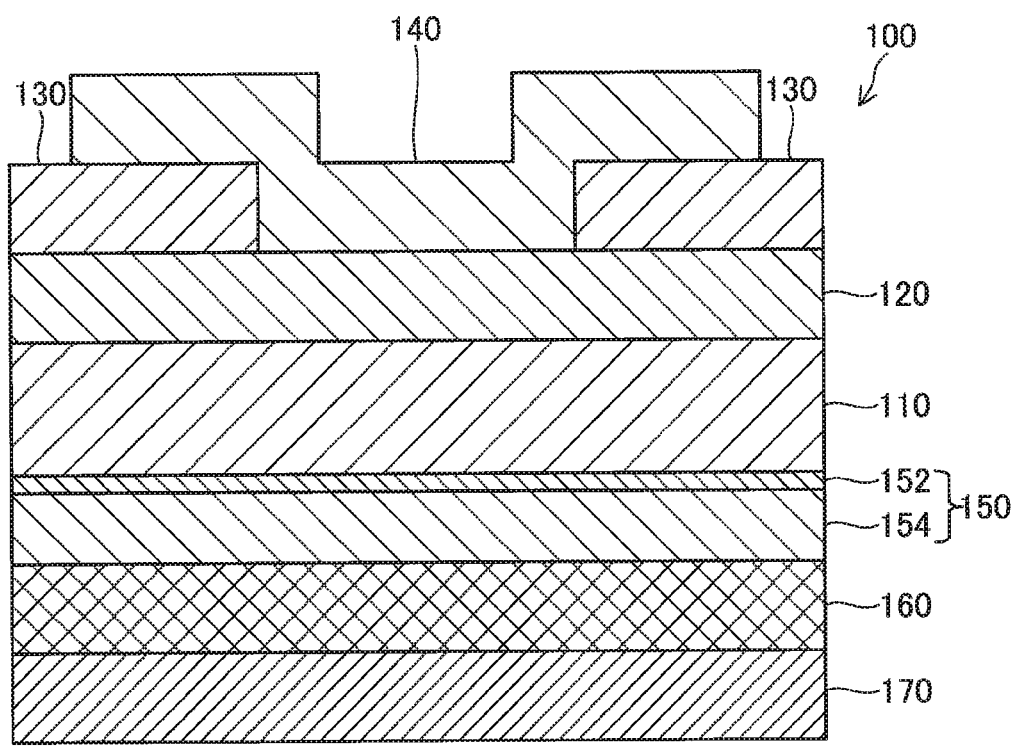
FIG. 1 is a sectional view schematically illustrating a configuration of a semiconductor device manufactured by a manufacturing method according to a first embodiment.

FIG. 1 is a sectional view schematically illustrating a configuration of a semiconductor device 100 manufactured by a manufacturing method according to a first embodiment. FIG. 1 illustrates an X axis, a Y axis, and a Z axis that cross orthogonally with each other. The X axis is an axis extending from the left side toward the right side on the sheet surface of FIG. 1. The Y axis is an axis extending from the closer side toward the farther side, as viewed by a viewer, on the sheet surface of FIG. 1. The Z axis is an axis extending from the lower side toward the upper side on the sheet surface of FIG. 1.

The semiconductor device 100 is a GaN-based semiconductor device formed by using gallium nitride (GaN). In the present embodiment, the semiconductor device 100 is a vertical Schottky barrier diode. In the present embodiment, the semiconductor device 100 is what is known as a power device that is used for power control. The semiconductor device 100 includes a semiconductor substrate 110, a semiconductor layer 120, insulation films 130, an anode electrode 140, an ohmic electrode 150, a barrier metal layer 160, and a wiring electrode 170.

The semiconductor substrate 110 is a semiconductor having a plate shape extending along the X axis and the Y axis. In the present embodiment, the semiconductor substrate 110 is made of a Group III nitride semiconductor examples of which include gallium nitride (GaN), aluminum-gallium nitride (AlGaN), indium-gallium nitride (InGaN), and aluminum-indium-gallium nitride (AlInGaN). Preferably, gallium nitride (GaN) or aluminum-gallium nitride (AlGaN), suitable for a power-control semiconductor according to the present disclosure, is used. In the present embodiment, gallium nitride (GaN) is used. This gallium nitride (GaN) may include aluminum or indium and may also include impurities such as silicon and magnesium, as long as advantageous effects of the present disclosure can be obtained. In the present embodiment, the semiconductor substrate 110 is an n-type semiconductor having n-type characteristics. In the present embodiment, the semiconductor substrate 110 includes silicon (Si) serving as a donor element.

The semiconductor layer 120 is formed on a +Z axis direction side of the semiconductor substrate 110. The semiconductor layer 120 is formed by epitaxial growth (crystal growth). In the present embodiment, the semiconductor layer 120 extends along the X axis and the Y axis. In the present embodiment, the semiconductor layer 120 is made of gallium nitride (GaN). In the present embodiment, the semiconductor layer 120 is an n-type semiconductor having n-type characteristics. In the present embodiment, the semiconductor layer 120 includes silicon (Si) serving as a donor element.

The insulation films 130 are insulators formed on a +Z axis direction side of the semiconductor layer 120. In the present embodiment, the insulation films 130 are formed on a +X axis direction end side and −X axis direction end side, on the +Z axis direction side of the semiconductor layer 120. In the present embodiment, the insulation films 130 each include a single insulation layer made of aluminum oxide ($Al_2O_3$). In other embodiments, the insulation films 130 may include an oxide, a nitride, and an oxynitride including at least one of silicon (Si), aluminum (Al), zirconium (Zr), hafnium (Hf), and the like. The insulation films 130 may each include a single layer or may include a plurality of layers.

The anode electrode 140 is a Schottky electrode formed on a +Z axis direction side of the insulation films 130 and on a portion of surface of the semiconductor layer 120 on the +Z axis direction side where the insulation films 130 are not formed. In the present embodiment, the anode electrode 140 includes a single metal layer made of nickel (Ni). In other embodiments, the anode electrode 140 may include at least one of palladium (Pd), platinum (Pt), iridium (Ir), and the like. In the present embodiment, the anode electrode 140 includes a single layer. In other embodiments, the anode electrode 140 may include a plurality of layers.

The ohmic electrode 150 is formed on a −Z axis direction side of the semiconductor substrate 110. In the present embodiment, the ohmic electrode 150 is formed by stacking an aluminum layer 154 made of aluminum (Al) on a titanium layer 152 made of titanium (Ti). In the present embodiment, the titanium layer 152 has a thickness of 30 nanometers (nm). In other embodiments, the titanium layer 152 may have any thickness within a range between 10 nm and 100 nm. In the present embodiment, the aluminum layer 154 has a thickness of 300 nm. In other embodiments, the aluminum layer 154 may have any thickness within a range between 200 nm and 500 nm. In other embodiments, a layer made of vanadium, instead of titanium (Ti), may be used.

In the present embodiment, the ohmic electrode 150 is formed by sputtering. The ohmic electrode 150 may be formed by using Chemical Vapor Deposition (CVD), Atomic Layer Deposition (ALD), Electron Beam (EB) vapor deposition, resistance heating vapor deposition, or the like, instead of sputtering.

The barrier metal layer 160 is formed on a −Z axis direction side of the ohmic electrode 150. The barrier metal layer 160 is provided for preventing metal diffusion between the ohmic electrode 150 and the wiring electrode 170. In the present embodiment, the barrier metal layer 160 has a thickness of 1000 nm. In other embodiments, the barrier metal layer 160 may have any thickness within a range between 100 nm and 2000 nm.

In the present embodiment, the barrier metal layer 160 includes titanium nitride (TiN). In other embodiments, the barrier metal layer 160 may include at least one of titanium, titanium nitride, molybdenum, nickel, tantalum, tantalum nitride, tungsten, and tungsten nitride. In the present embodiment, the barrier metal layer 160 includes a single layer. In other embodiments, the barrier metal layer 160 may include a plurality of layers.

The wiring electrode 170 is formed on a −Z axis direction side of the barrier metal layer 160. In the present embodiment, the wiring electrode 170 includes silver. In other embodiments, the wiring electrode 170 may include at least one of gold, silver, and copper. With the wiring electrode 170 including such metals, the semiconductor device 100 including the wiring electrode 170 with a low electrical resistance value is manufactured.

In the present embodiment, the wiring electrode 170 has a thickness of 200 nm. In other embodiments, the wiring electrode 170 may have any thickness equal to or larger than 100 nm.

In the present embodiment, the wiring electrode 170 is formed by sputtering. The wiring electrode 170 may be formed by using CVD, ALD, EB vapor deposition, resistance heating vapor deposition, or the like, instead of sputtering.

A-2. Manufacturing Method for Semiconductor Device

Figure 2:
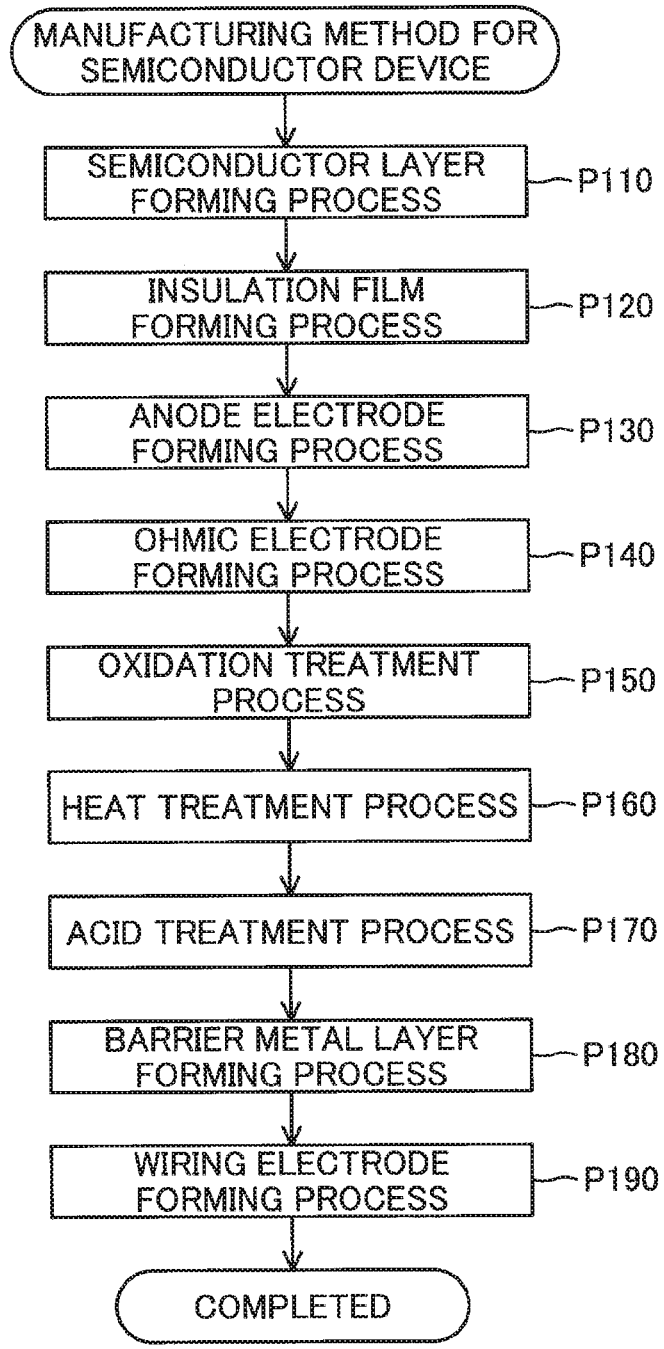
FIG. 2 is a process chart illustrating processes in the manufacturing method for the semiconductor device according to the first embodiment.

FIG. 2 is a process chart illustrating processes in the manufacturing method for the semiconductor device 100 according to the first embodiment. First of all, a manufacturer of the semiconductor device 100 performs a semiconductor layer forming process of forming the semiconductor layer 120 on a surface of the semiconductor substrate 110 (process P110). In the present embodiment, the manufacturer employs epitaxial growth using Metal Organic Chemical Vapor Deposition (MOCVD) to perform the semiconductor layer forming process.

After the semiconductor layer forming process (process P110), the manufacturer performs an insulation film forming process of forming the insulation films 130 (process P120). In the present embodiment, the manufacturer employs Atomic Layer Deposition (ALD) for forming the insulation layer including aluminum oxide ($Al_2O_3$), to perform the insulation film forming process. In the present embodiment, the manufacturer etches a center portion of the insulation films 130 thus formed, in the X axis direction, by wet etching. Instead of wet etching, dry etching or a combination of dry etching and wet etching may be employed.

After the insulation film forming process (process P120), the manufacturer performs an anode electrode forming process of forming the anode electrode 140 on the insulation films 130 and on a surface of the semiconductor layer 120 exposed as a result of etching the insulation films 130 (process P130). In the present embodiment, the manufacturer employs EB vapor deposition to perform the anode electrode forming process. Instead of EB vapor deposition, sputtering or resistance heating vapor deposition may be used.

After the anode electrode forming process (process P130), the manufacturer performs a wet etching process of performing wet etching on a surface of the semiconductor substrate 110 opposite to the side where the semiconductor layer 120 is formed. In the present embodiment, tetramethylammonium hydroxide (TMAH) may be used as an etchant for wet etching. The etchant that can be used, other than TMAH, includes potassium hydroxide (KOH) and phosphoric acid ($H_3PO_4$). When the wet etching process is performed, a side adjacent to the anode electrode 140 may be protected with a resist.

After the anode electrode forming process (process P130) and the wet etching process, the manufacturer performs an ohmic electrode forming process of forming the ohmic electrode 150 on the surface of the semiconductor substrate 110 opposite to the side where the semiconductor layer 120 is formed (process P140). In the present embodiment, the manufacturer stacks the titanium layer 152 and the aluminum layer 154 in this order by sputtering, to perform the ohmic electrode forming process. Specifically, the aluminum layer 154 is formed on the side of the ohmic electrode 150 opposite to the side in contact with the semiconductor substrate 110.

After the ohmic electrode forming process (process P140), the manufacturer performs an oxidation treatment process of performing oxidation treatment on the ohmic electrode 150 (process P150). As a result of the oxidation treatment, an oxide film is formed on a surface of the aluminum layer 154. In the present embodiment, the manufacturer employs oxygen plasma treatment to perform the oxidation treatment process. In the present embodiment, the oxygen plasma treatment is performed under conditions including: applied power of 100 W; pressure of 150 Pa; and process time of 240 seconds. In other embodiments, the oxygen plasma treatment may be performed under conditions including: applied power of 100 W; pressure of 150 Pa; and any process time selected within a range between 5 seconds and 300 seconds. With the oxygen plasma treatment performed for such process time, the surface of the aluminum layer 154 can be sufficiently oxidized.

After the oxidation treatment process (process P150), the manufacturer performs a heat treatment process of performing heat treatment on the surface of the aluminum layer 154 after the oxidation treatment (process P160). The heat treatment is a process of setting a temperature environment around a process target object to be a predetermined environment. In the present embodiment, the heat treatment is performed under conditions including: a nitrogen atmosphere; 450° C.; and process time of 30 minutes. In other embodiments, the heat treatment may be performed under conditions including: a nitrogen atmosphere; any temperature selected within a range between 350° C. and 600° C.; and any process time selected within a range between 5 minutes and 60 minutes. With the heat treatment performed under such a temperature condition, sufficient ohmic contact can be achieved in a contact portion between the semiconductor substrate 110 and the ohmic electrode 150.

After the heat treatment process (process P160), the manufacturer performs an acid treatment process of performing acid treatment on the surface of the aluminum layer 154 after the heat treatment (process P170). In the present embodiment, the acid treatment performed by using buffered hydrofluoric acid can efficiently remove a portion of the aluminum layer 154 where an oxide film that is an oxidized surface is formed. The acid treatment may also be performed by using dilute hydrofluoric acid. However, dilute hydrofluoric acid might result in aluminum being etched. Thus, buffered hydrofluoric acid is preferably used.

In the present embodiment, the acid treatment is performed under a condition including process time of 30 seconds. In other embodiments, the acid treatment may be performed under a condition including any process time selected within a range between 1 second and 60 seconds. The acid treatment performed under the condition of such process time can sufficiently remove the portion of the aluminum layer 154 where the oxide film is formed.

After the acid treatment process (process P170), the manufacturer performs a barrier metal layer forming process of forming the barrier metal layer 160 on the surface of the aluminum layer 154 after the acid treatment (process P180). In the present embodiment, the manufacturer employs sputtering to perform the barrier metal layer forming process. The barrier metal layer 160 may also be formed by employing CVD, ALD, EB vapor deposition, resistance heating vapor deposition, or the like, instead of sputtering.

After the barrier metal layer forming process (process P180), the manufacturer performs a wiring electrode forming process of forming the wiring electrode 170 on a surface of the barrier metal layer 160 (process P190). In the present embodiment, the manufacturer employs sputtering to perform the wiring electrode forming process. The wiring electrode 170 may also be formed by employing CVD, ALD, EB vapor deposition, resistance heating vapor deposition, or the like, instead of sputtering. The semiconductor device 100 illustrated in FIG. 1 is completed through the process P110 to the process P190.

A-3. Evaluation Test

The examiner has prepared the semiconductor device 100 as well as four semiconductor devices manufactured with manufacturing methods different from that for the semiconductor device 100, for an evaluation test. The four semiconductor devices are referred to as a semiconductor device 200, a semiconductor device 300, a semiconductor device 400, and a semiconductor device 500. The manufacturing methods for the four semiconductor devices were the same as the manufacturing method for the semiconductor device 100 up until the ohmic electrode forming process (process P140). The manufacturing methods for the four semiconductor devices included oxidation treatment, heat treatment, and acid treatment performed under the same conditions as those in the manufacturing method for the semiconductor device 100.

The manufacturing method for the semiconductor device 200 is obtained by omitting the oxidation treatment process (process P150) from the manufacturing method for the semiconductor device 100. Thus, in the manufacturing method for the semiconductor device 200, the heat treatment is performed after the ohmic electrode forming process (process P140). After the heat treatment, the acid treatment was performed, the barrier metal layer 160 is formed on the surface of the aluminum layer 154, and the wiring electrode 170 is formed on the surface of the barrier metal layer 160. Thus, the semiconductor device 200 is completed. The manufacturing method for the semiconductor device 200 includes no oxidation treatment process (process P150). Still, a natural oxide film is formed on the surface of the aluminum layer 154 with the aluminum layer 154 being exposed to the atmosphere to combine with oxygen in the atmosphere between the ohmic electrode forming process (process P140) and the heat treatment process (process P160).

In the manufacturing method for the semiconductor device 300, the process of forming the barrier metal layer 160 on the surface of the aluminum layer 154 and the process of forming the wiring electrode 170 on the surface of the barrier metal layer 160 are sequentially performed after the ohmic electrode forming process (process P140). After the wiring electrode 170 is formed, the heat treatment is performed. Thus, the semiconductor device 300 is completed. The oxidation treatment process (process P150) and the acid treatment process (process P170) are not performed in the manufacturing method for the semiconductor device 300.

In the manufacturing method for the semiconductor device 400, the heat treatment is performed after the ohmic electrode forming process (process P140). After the heat treatment, the process of forming the barrier metal layer 160 on the surface of the aluminum layer 154 and the process of forming the wiring electrode 170 on the surface of the barrier metal layer 160 are performed. Thus, the semiconductor device 400 is completed. The oxidation treatment process (process P150) and the acid treatment process (process P170) are not performed in the manufacturing method for the semiconductor device 400.

The manufacturing method for the semiconductor device 500 is obtained by omitting the acid treatment process (process P170) from the manufacturing method for the semiconductor device 100. Thus, in the manufacturing method for the semiconductor device 500, the oxidation treatment is performed after the ohmic electrode forming process (process P140). After the oxidation treatment, the heat treatment was performed, and then the process of forming the barrier metal layer 160 on the surface of the aluminum layer 154 and the process of forming the wiring electrode 170 on the surface of the barrier metal layer 160 are performed. Thus, the semiconductor device 500 is completed.

The examiner has checked whether metal diffusion from the ohmic electrode 150 to the wiring electrode 170 has occurred by performing Energy dispersive X-ray (EDX) analysis on the surface of the wiring electrode 170 in each of the semiconductor devices 100, 200, 300, 400, and 500.

The examiner has found that aluminum, which is metal constituting the ohmic electrode 150, was detected in the wiring electrode 170 of the semiconductor device 300. The examiner has found that no aluminum was detected in the wiring electrode 170 of each of the semiconductor devices 100, 200, 400, and 500. In the semiconductor device 300, aluminum has diffused from the aluminum layer 154, in the ohmic electrode 150, to the wiring electrode 170 supposedly because the heat treatment was performed after the ohmic electrode 150, the barrier metal layer 160, and the wiring electrode 170 were formed.

In the manufacturing methods for the semiconductor devices 100, 200, 400, and 500, the aluminum diffusion between the ohmic electrode 150 and the wiring electrode 170 was prevented during the heat treatment supposedly because the barrier metal layer 160 and the wiring electrode 170 were formed on the surface of the ohmic electrode 150 after the heat treatment has been performed.

Then, the examiner has measured the IV characteristics in a forward direction using the semiconductor devices 100, 200, 300, 400, and 500, to measure a resistance value of each of the semiconductor devices 100, 200, 300, 400, and 500. The resistance value as used herein is a value indicating a sum of electrical resistance values of the semiconductor substrate 110, the semiconductor layer 120, the anode electrode 140, the ohmic electrode 150, the barrier metal layer 160, and the wiring electrode 170 and of contact resistances among these.

Figure 3:
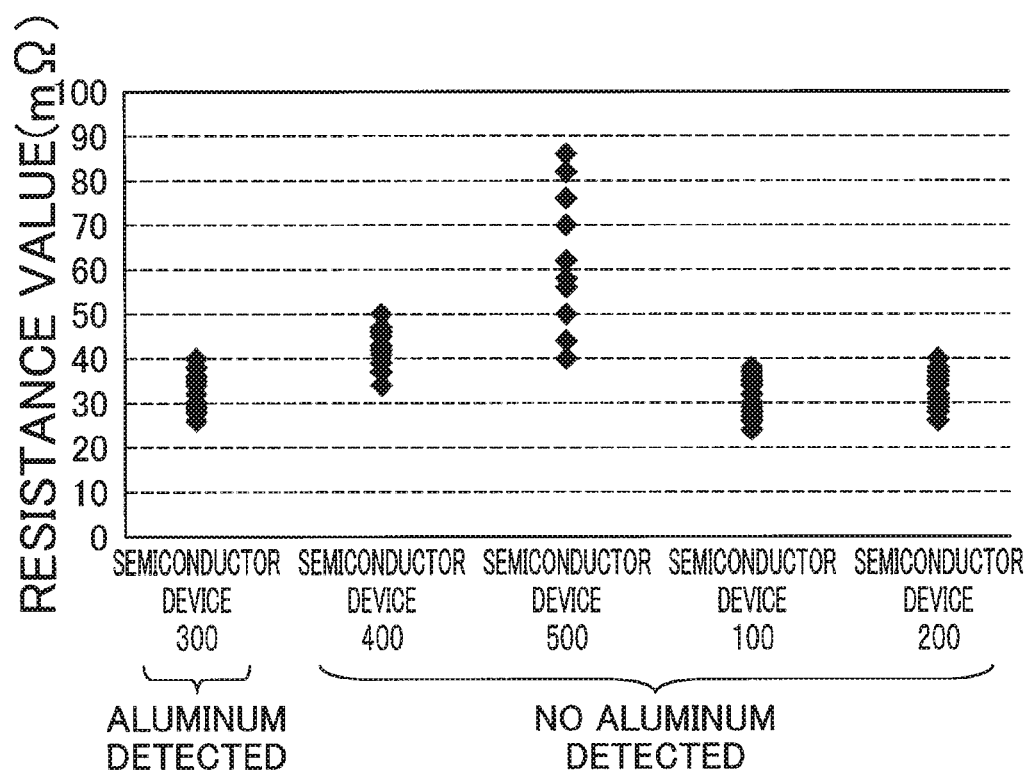
FIG. 3 is a graph illustrating results of measuring resistance values of semiconductor devices.

FIG. 3 is a graph illustrating results of measuring the resistance values of the semiconductor devices 100, 200, 300, 400, and 500. The vertical axis in FIG. 3 represents the resistance value. In the figure, "aluminum detected" and "no aluminum detected" are results of the EDX analysis for each of the semiconductor devices.

The resistance value of the semiconductor device 100 was within a range between 26.2 m$\Omega$ and 37.5 m$\Omega$. The resistance value of the semiconductor device 200 was within a range between 26.1 m$\Omega$ and 39.7 m$\Omega$. The resistance value of the semiconductor device 300 was within a range between 26.6 m$\Omega$ and 39.3 m$\Omega$. The resistance value of the semiconductor device 400 was within a range between 33.1 m$\Omega$ and 50.8 m$\Omega$. The resistance value of the semiconductor device 500 was within a range between 40.6 m$\Omega$ and 85.1 m$\Omega$. The resistance value of the semiconductor devices 100, 200, 300, 400, and 500 prepared for the test are designed to be less than 40 m$\Omega$ in the specification. Thus, such a design value upper limit (40 m$\Omega$) may be used as a reference value for determining whether the device has a low resistance value or a high resistance value, for the results in FIG. 3. As a result, the semiconductor devices 100, 200, and 300 were determined to have a low electrical resistance value, whereas the semiconductor devices 400 and 500 were determined to have a high electrical resistance value.

In the manufacturing method for the semiconductor device 400, the natural oxide film is formed on the surface of the ohmic electrode 150 before the heat treatment was performed. Thus, the natural oxide film can serve as a surface protection film to prevent metal contamination or impurity attachment on the surface of the ohmic electrode 150 during the heat treatment. However, the lack of the acid treatment process thereafter has resulted in a high resistance value because the barrier metal layer 160 and the wiring electrode 170 are formed with the high resistance value oxide film existing on the surface of the ohmic electrode 150. Similarly, the semiconductor device 500 has a high resistance value due to the oxide film on the surface of the ohmic electrode 150. The semiconductor device 500 has a higher resistance value than the semiconductor device 400 supposedly because the semiconductor device 500 has more oxide films than the semiconductor device 400. This is supposedly because the manufacturing method for the semiconductor device 500 includes the oxidation treatment process which was omitted in the manufacturing method for the semiconductor device 400.

In the manufacturing method for the semiconductor device 300, the heat treatment is performed with the ohmic electrode 150 not exposed due to the barrier metal layer 160 and the wiring electrode 170 formed on the surface of the ohmic electrode 150. Thus, the surface of the ohmic electrode 150 is free of metal contamination or impurity attachment, supposedly resulting in a low electrical resistance value. Furthermore, no oxide film is existed between the ohmic electrode 150 and the barrier metal layer 160. Supposedly, this might have also contributed to the low electrical resistance value of the semiconductor device 300.

In the manufacturing method for the semiconductor device 100, the oxide film is formed on the ohmic electrode 150 before the heat treatment was performed. Thus, the oxide film has served as the surface protection film to prevent metal contamination or impurity attachment on the surface of the ohmic electrode 150 during the heat treatment. In the manufacturing method for the semiconductor device 100, the oxide film with a high electrical resistance value is removed by the acid treatment. Thus, the barrier metal layer 160 and the wiring electrode 170 are formed after the surface of the ohmic electrode 150 that is free of metal contamination or impurity attachment and does not have the oxide film was obtained. This supposedly has led to the semiconductor device 100 having a low electrical resistance value.

In the manufacturing method for the semiconductor device 200, the natural oxide film is formed on the surface of the ohmic electrode 150 before the heat treatment was performed. Thus, the natural oxide film serves as the surface protection film to prevent metal contamination and impurity attachment on the surface of the ohmic electrode 150 during the heat treatment. In the manufacturing method for the semiconductor device 200, the natural oxide film with a high electrical resistance value is removed by the acid treatment. Thus, the barrier metal layer 160 and the wiring electrode 170 are formed after the surface of the ohmic electrode 150 that is free of metal contamination or impurity attachment and does not have the oxide film was obtained. This supposedly has led to the semiconductor device 200 having a low electrical resistance value.

In the manufacturing method for the semiconductor device 100 according to the first embodiment described above, the heat treatment is performed on the ohmic electrode with the oxidized surface of the aluminum layer 154 serving as the surface protection film to prevent metal contamination and impurity attachment on the side of the ohmic electrode 150 opposite to the side where the semiconductor substrate 110 is provided after the ohmic electrode forming process (process P140). Then, the acid treatment process is preformed to remove the oxidized surface of the aluminum layer 154. Thus, the surface of the ohmic electrode 150 that is free of metal contamination or impurity attachment and includes no oxide film can be obtained. The wiring electrode 170 is formed on the surface thus obtained. Thus, metal diffusion between the ohmic electrode 150 and the wiring electrode 170 can be prevented, while preventing the semiconductor device 100 from functioning with a high resistance value. All things considered, the semiconductor device 100 with high reliability can be manufactured.

In the first embodiment, the oxidation treatment process (process P150) is performed so that the surface of the aluminum layer 154 is more actively oxidized than in the manufacturing method for the semiconductor device 200 including no oxidation treatment process (process P150). This more effectively ensures the oxidization of the surface of the aluminum layer 154. The oxidized surface of the aluminum layer 154 serves as the surface protection film to more effectively ensure prevention of metal contamination and impurity attachment on the side of the ohmic electrode 150 opposite to the side where the semiconductor substrate 110 is provided, during the heat treatment on the ohmic electrode 150.

In the first embodiment, the barrier metal layer forming process (process P180) is performed so that the metal diffusion between the ohmic electrode 150 and the wiring electrode 170 can be prevented by the processes during the wiring electrode forming process (process P190) and after.

B. Modification

B1. Modification 1

In the first embodiment, the oxidation treatment process (process P150) is performed. However, the present disclosure is not limited to this. For example, a semiconductor device may be manufactured by a manufacturing method obtained by omitting the oxidation treatment process (process P150) from the manufacturing method for the semiconductor device 100, as in the case of the manufacturing method for the semiconductor device 200. Also in such a manufacturing method for a semiconductor device, metal diffusion between the ohmic electrode 150 and the wiring electrode 170 can be prevented, while preventing the semiconductor device from having a high electrical resistance value. Thus, manufacturing of a semiconductor device with high reliability can be achieved.

B2. Modification 2

In the first embodiment, the barrier metal layer forming process (process P180) is performed. However, the present disclosure is not limited to this. For example, a semiconductor device may be manufactured by a manufacturing method obtained by omitting the barrier metal layer forming process (process P180) from the manufacturing method for the semiconductor device 100. In this configuration, the wiring electrode 170 is directly formed on the surface of the aluminum layer 154. Thus, generally, a manufacturing method for a semiconductor device including a wiring electrode forming process of forming the wiring electrode 170 on a side farther from the semiconductor substrate 110 than the surface of the aluminum layer 154 after the acid treatment can be applied to the manufacturing method for a semiconductor device according to the present disclosure.

B3. Modification 3

In the first embodiment, the semiconductor layer forming process (process P110), the insulation film forming process (process P120), and the anode electrode forming process (process P130) are performed and then the ohmic electrode forming process (process P140) and the oxidation treatment process (process P150) are performed. However, the present disclosure is not limited to this. For example, a manufacturing method for a semiconductor device in which the ohmic electrode forming process (process P140) and the oxidation treatment process (process P150) are performed before the semiconductor layer forming process (process P110), the insulation film forming process (process P120), and the anode electrode forming process (process P130) are performed may be employed. In such a manufacturing method for a semiconductor device, the oxide film is formed on the side of the ohmic electrode 150 opposite to the side where the semiconductor substrate 110 is provided to prevent metal contamination and impurity attachment on the ohmic electrode 150. This enables a change in processes in the manufacturing method for the semiconductor device, such as performing a process of forming an element on a side of the semiconductor substrate 110 opposite to the side where the ohmic electrode 150 is provided, after the oxidation treatment process (process P150).

The disclosure is not limited to any of the embodiment and its modifications described above but may be implemented by a diversity of configurations without departing from the scope of the disclosure. For example, the technical features of any of the embodiments and their modifications may be replaced or combined appropriately, in order to solve part or all of the problems described above or in order to achieve part or all of the advantageous effects described above. Any of the technical features may be omitted appropriately unless the technical feature is described as essential in the description hereof. The present disclosure may be implemented by aspects described below.

An aspect of the present disclosure provides a manufacturing method for a semiconductor device. The manufacturing method for a semiconductor device comprises forming an ohmic electrode on a surface of a semiconductor substrate, the ohmic electrode including an aluminum layer in a side opposite to a side in contact with the semiconductor substrate, performing a heat treatment on the ohmic electrode, performing an acid treatment on a surface of the aluminum layer in the ohmic electrode that has been subjected to the heat treatment and forming a wiring electrode in the side of the aluminum layer opposite to the side where the semiconductor substrate is provided after the acid treatment. With this aspect, after the ohmic electrode forming process, the heat treatment is performed on the ohmic electrode with the oxidized surface of the aluminum layer serving as a surface protection film to prevent metal contamination and impurity attachment on the side of the ohmic electrode opposite to the side where the semiconductor substrate is provided. Then, the acid treatment process is preformed to remove the oxidized surface of the aluminum layer. Thus, the surface of the ohmic electrode that is free of metal contamination or impurity attachment and includes no oxide film can be obtained. Thus, metal diffusion between an ohmic electrode and a wiring electrode is prevented while preventing a semiconductor device from having a high electrical resistance value. All things considered, the semiconductor device with high reliability can be manufactured.

The manufacturing method for a semiconductor device according to the above described aspect may further comprise performing an oxidation treatment on a surface of the aluminum layer before the heat treatment, the performing the oxidation treatment being performed between the forming the ohmic electrode and the performing the heat treatment. With this aspect, the aluminum layer is more actively oxidized than in a manufacturing method including no oxidation treatment process. This more effectively ensures the oxidization of the surface of the aluminum layer. The oxidized surface of the aluminum layer serves as the surface protection film to more effectively ensure prevention of metal contamination and impurity attachment on the side of the ohmic electrode opposite to the side where the semiconductor substrate is provided, during the heat treatment on the ohmic electrode.

The manufacturing method for a semiconductor device according to the above described aspect may further comprise forming a barrier metal layer on the surface of the aluminum layer after the acid treatment, the forming the barrier metal layer being performed between the performing the acid treatment and the forming the wiring electrode. The forming the wiring electrode may include forming the wiring electrode on a surface of the barrier metal layer. With this aspect, the barrier metal layer is formed between the aluminum layer and the wiring electrode. Thus, the metal diffusion between the aluminum layer and the wiring electrode can be prevented from occurring in the wiring electrode forming process and after.

In the manufacturing method for a semiconductor device according to the above described aspect, temperature in the performing the heat treatment may be equal to or higher than 350° C. and equal to or lower than 600° C. With this aspect, sufficient ohmic contact can be achieved in a contact portion between the semiconductor substrate and the ohmic electrode.

In the manufacturing method for a semiconductor device according to the above described aspect, the performing the acid treatment may be performed by using buffered hydrofluoric acid. With this aspect, a portion of the aluminum layer having the oxidized surface can be efficiently removed.

In the manufacturing method for a semiconductor device according to the above described aspect, process time in the performing the acid treatment may be equal to or longer than 1 second and equal to or shorter than 60 seconds. With this aspect, the portion of the aluminum layer having the oxidized surface can be efficiently removed.

In the manufacturing method for a semiconductor device according to the above described aspect, process time in the performing the oxidation treatment may be equal to or longer than 5 seconds and equal to or shorter than 300 seconds. With this aspect, the surface of the aluminum layer can be sufficiently oxidized.

In the manufacturing method for a semiconductor device according to the above described aspect, the semiconductor substrate may be made of gallium nitride. With this aspect, a semiconductor device including the semiconductor substrate made of gallium nitride can be manufactured.

In the manufacturing method for a semiconductor device according to the above described aspect, the wiring electrode may include at least one of gold, silver, and copper. With this aspect, a semiconductor device including the wiring electrode with a low electrical resistance can be manufactured.

In the manufacturing method for a semiconductor device according to the above described aspect, the barrier metal layer may include at least one of titanium, titanium nitride, molybdenum, nickel, tantalum, tantalum nitride, tungsten, and tungsten nitride. With this aspect, a semiconductor device including the e barrier metal layer made of metal described above can be manufactured.

The present disclosure can be implemented in various modes other than the manufacturing method for a semiconductor device. For example, the present disclosure may be implemented as a semiconductor device and a power converter device or the like including a semiconductor device. The present disclosure is not limited to any of the modes described above, and can be implemented in various modes without departing from the gist of the present disclosure.

What is claimed is:

1. A manufacturing method of a semiconductor device, the method comprising:
    forming an ohmic electrode on a surface of a semiconductor substrate, the ohmic electrode including an aluminum layer in a side opposite to a side in contact with the semiconductor substrate;
    performing a heat treatment on the ohmic electrode;
    performing an acid treatment on a surface of the aluminum layer in the ohmic electrode that has been subjected to the heat treatment to remove an oxide film from the aluminum layer; and
    forming a wiring electrode in a side of the aluminum layer opposite to a side where the semiconductor substrate is provided after the acid treatment,
    wherein, after the forming of the wiring electrode, in a cross-sectional view, the aluminum layer continuously extends, from an outer edge of the semiconductor substrate to another outer edge of the semiconductor substrate, on the surface of the semiconductor substrate.

2. The manufacturing method of a semiconductor device according to claim 1, further comprising:
    performing an oxidation treatment on a surface of the aluminum layer before the heat treatment, the performing the oxidation treatment being performed between the forming the ohmic electrode and the performing the heat treatment.

3. The manufacturing method of a semiconductor device according to claim 1, further comprising:
    forming a barrier metal layer on the surface of the aluminum layer after the acid treatment, the forming the barrier metal layer being performed between the performing the acid treatment and the forming the wiring electrode,
    wherein the forming the wiring electrode includes forming the wiring electrode on a surface of the barrier metal layer.

4. The manufacturing method of a semiconductor device according to claim 1, wherein temperature in the performing the heat treatment is equal to or higher than 350° C. and equal to or lower than 600° C.

5. The manufacturing method of a semiconductor device according to claim 1, wherein the performing the acid treatment is performed by using buffered hydrofluoric acid.

6. The manufacturing method of a semiconductor device according to claim 1, wherein a process time in the performing the acid treatment is equal to or longer than 1 second and equal to or shorter than 60 seconds.

7. The manufacturing method of a semiconductor device according to claim 2, wherein a process time in the performing the oxidation treatment is equal to or longer than 5 seconds and equal to or shorter than 300 seconds.

8. The manufacturing method of a semiconductor device according to claim 1, wherein the semiconductor substrate comprises gallium nitride.

9. The manufacturing method of a semiconductor device according to claim 1, wherein the wiring electrode includes at least one of gold, silver, and copper.

10. The manufacturing method of a semiconductor device according to claim 3, wherein the barrier metal layer includes at least one of titanium, titanium nitride, molybdenum, nickel, tantalum, tantalum nitride, tungsten, and tungsten nitride.

11. The manufacturing method of a semiconductor device according to claim 1, wherein the acid treatment is performed on an entirety of the surface of the aluminum layer.

12. The manufacturing method of a semiconductor device according to claim 1, wherein the acid treatment is performed consecutively after the heat treatment.

13. The manufacturing method of a semiconductor device according to claim 1, wherein the forming the ohmic electrode comprises disposing a titanium layer between the aluminum layer and the semiconductor substrate.

14. The manufacturing method of a semiconductor device according to claim 1, further comprising:
   disposing a semiconductor layer on another surface of the semiconductor substrate before the forming of the ohmic electrode; and
   disposing an insulation film on a surface of the semiconductor layer.

15. The manufacturing method of a semiconductor device according to claim 14, further comprising:
   disposing an anode electrode on a surface of the insulation film and the surface of the semiconductor layer.

16. A manufacturing method of a semiconductor device, the method comprising:
   forming an ohmic electrode including an aluminum layer on a surface of a semiconductor substrate;
   performing a heat treatment on the ohmic electrode;
   removing a portion of a surface of the aluminum layer by performing an acid treatment on a surface of the aluminum layer; and
   forming a wiring electrode in a side of the aluminum layer on which the acid treatment is performed,
   wherein, after the forming of the wiring electrode, in a cross-sectional view, the aluminum layer continuously extends, from an outer edge of the semiconductor substrate to another outer edge of the semiconductor substrate, on the surface of the semiconductor substrate.

17. The manufacturing method of a semiconductor device according to claim 16, wherein the acid treatment is performed on an entirety of the surface of the aluminum layer.

18. The manufacturing method of a semiconductor device according to claim 16, wherein the forming the ohmic electrode comprises disposing a titanium layer between the aluminum layer and the semiconductor substrate.

19. A manufacturing method of a semiconductor device, the method comprising:
   forming an ohmic electrode including an aluminum layer on a surface of a semiconductor substrate;
   performing a heat treatment on the ohmic electrode;
   removing a portion of a surface of the aluminum layer by performing an acid treatment on a surface of the aluminum layer;
   forming a wiring electrode in a side of the aluminum layer on which the acid treatment is performed;
   disposing a semiconductor layer on another surface of the semiconductor substrate before the forming of the ohmic electrode; and
   disposing an insulation film on a surface of the semiconductor layer.

20. The manufacturing method of a semiconductor device according to claim 19, further comprising:
   disposing an anode electrode on a surface of the insulation film and the surface of the semiconductor layer.

* * * * *